United States Patent [19]
Chang

[11] Patent Number: 6,165,844
[45] Date of Patent: Dec. 26, 2000

[54] METHOD FOR FORMING A TEXTURED SURFACE ON A SEMICONDUCTOR SUBSTRATE AND A TUNNELING OXIDE LAYER ON THE TEXTURED SURFACE

[75] Inventor: Kow-Ming Chang, Hsinchu, Taiwan

[73] Assignee: United Microelectronics Corp., Hsinchu, Taiwan

[21] Appl. No.: 09/195,910

[22] Filed: Nov. 19, 1998

[51] Int. Cl.[7] .............................................. H01L 21/8247
[52] U.S. Cl. ............................................ 438/260; 438/964
[58] Field of Search .................................... 438/257, 260, 438/263, 264, 265, 665, 964

[56] References Cited

U.S. PATENT DOCUMENTS

| | | | |
|---|---|---|---|
| 5,504,022 | 4/1996 | Nakanishi et al. | 438/260 |
| 5,521,108 | 5/1996 | Rostoker et al. | 438/260 |
| 5,879,978 | 3/1999 | Ra | 438/260 |

*Primary Examiner*—Chandra Chaudhari
*Attorney, Agent, or Firm*—Thomas, Kayden, Horstemeyer & Risley

[57] ABSTRACT

A method is provided for fabricating a tunneling oxide layer over a semiconductor substrate with a textured surface. The method is suitable for a semiconductor substrate, such as a silicon substrate, having a polysilicon layer formed over the substrate. The method has several steps of performing a thermal oxidation process to over oxidize the polysilicon layer so as to form an interfacial oxide layer between the substrate and the polysilicon layer, which actually is oxidized as an oxide layer. Due to material property of polysilicon, a textured surface is naturally formed on a top of the substrate. After removing the oxide layer and the interfacial oxide layer, a tunneling oxide layer is formed over the substrate with the textured surface.

20 Claims, 7 Drawing Sheets

METHOD FOR FORMING A TEXTURED SURFACE ON A SEMICONDUCTOR SUBSTRATE AND A TUNNELING OXIDE LAYER ON THE TEXTURED SURFACE

BACKGROUND OF THE INVENTION

1. Field of the Invention

This invention relates to semiconductor fabrication, and more particularly to a method for forming a textured surface on a semiconductor substrate by an over-thermal oxidation process and forming a tunneling oxide layer on the textured surface.

2. Description of Related Art

In order to fabricate a memory device with high density and low cost so as to satisfy a marketing desires, an electrically erasable programmable read only memory (EEPROM) is developed for the purpose. The EEPROM uses a Fowler-Nordheim tunnel effect to program or erase binary data stored in the EEPROM. The programming/erasing operation is done bit by bit so that it takes time. Another faster memory device, called flashing memory, is also developed. The flash memory has similar structure as the EEPROM but the programming and erasing functions are performed through block by block.

It is a trend for a semiconductor device to have a low operating bias so that the EEPROM or the flash memory also need a low operating bias. In order to have the low operating bias, it is necessary to have a tunneling oxide layer with properties of high electron injection efficiency and high duration of charge to breakdown ($Q_{bd}$). The tunneling oxide layer used in the EEPROM with low operating bias is necessary to be formed on a substrate with textured surface so that the thickness of the tunneling oxide layer is not necessary to be thinned.

A conventional fabrication process for forming a tunneling oxide layer on a semiconductor substrate with textured surface is schematically shown in FIGS. 1A–1C. In FIG. 1A, a semiconductor substrate 100, such as a silicon substrate, is provided. In FIG. 1B, a reactive ion etching (RIE) process is directly performed on the substrate 100 so as to form a substrate 102 with textured surface. In FIG. 1C, a tunneling oxide layer 104 is formed over the substrate 102.

However, as the RIE process is performed, the plasma source may easily cause plasma damage and plasma contamination to affect the tunneling oxide layer 104, resulting in a poor performance of the EEPROM. Moreover, the RIE process including the reaction etchant gas, the pressure of the etchant gas, the power of plasma source, and several processes for fixing the plasma damage and cleaning the plasma contamination is complicate, resulting in a difficulty of use.

FIGS. 2A–2B are cross-sectional views of a portion of a semiconductor substrate, schematically illustrating an another fabrication process for forming a tunneling oxide layer on the semiconductor substrate with textured surface. In FIG. 2A, a semiconductor substrate 200 is provided. A polysilicon layer 202 is formed over the substrate 200 by low pressure chemical vapor deposition (LPCVD). In FIG. 2B, a thermal oxidation is performed on the polysilicon layer 202. The thermal process is necessary to be property controlled so as to just fully oxidize the polysilicon layer 202. Since the polysilicon layer 202 includes large number of polycrystals and grain boundaries between polycrystals, the polycrystals and the grain boundaries have different oxidation rate. After the thermal oxidation process a textured structure is automatically formed. The polysilicon layer 202 and the substrate 200 of FIG. 2A respectively become a textured oxide layer 206 and a textured substrate 204. A textured surface exists at the interface between the textured oxide layer 206 and the textured substrate 204. The textured oxide layer 206 serves as a conventional another tunneling oxide layer. Several subsequent structures (not shown) are then formed over the textured substrate 204 to accomplish a memory fabrication.

However, in the above another conventional example, the duration time of the thermal oxidation process should be precisely controlled to just oxidize the polysilicon layer 202. If an incomplete oxidation occurs, a performance of the tunneling oxide layer is deteriorated due to remaining polysilicon without being oxidized. The performance of the tunneling oxide layer is also deteriorated if an over oxidation occurs, causing the textured substrate 204 is over oxidized. Since the polysilicon layer 202 usually is very thin, it is difficult to control the oxidation rate and the duration time to just completely oxidize the polysilicon layer 202. This causes a complexity of this conventional method.

All above two conventional methods have their drawbacks. The first conventional example has issues of plasma damage and plasma contamination. The second conventional example has a difficulty to control the oxidation rate and the oxidation duration time.

SUMMARY OF THE INVENTION

It is therefore an objective of the present invention to provide a method for fabricating a tunneling oxide layer over a semiconductor substrate with a textured surface. The method has properties of lower complexity and higher reliability. The tunnel oxide layer therefore has higher quality.

In accordance with the foregoing and other objectives of the present invention, an improved method is provided for fabricating a tunneling oxide layer over a semiconductor substrate with a textured surface. The improved method is suitable for a semiconductor substrate, such as a silicon substrate, having a polysilicon layer formed over the substrate. The improved method includes performing a thermal oxidation process to over oxidize the polysilicon layer so as to form an interfacial oxide layer between the substrate and the polysilicon layer, which actually is oxidized as an oxide layer. Due to material property of polysilicon, a textured surface is naturally formed on a top of the substrate. The interfacial oxide layer over the textured surface is a sacrificial layer. After removing the oxide layer and the interfacial oxide layer, a tunneling oxide layer is formed over the substrate with the textured surface.

In the foregoing, the thermal oxidation process is desired to over oxidize the polysilicon layer so that there is no need of precise control of oxidation on the polysilicon layer. The fabrication complexity is effectively reduced. Moreover, the improved method includes no plasma etching process so that there is no plasma damage and plasma contamination occurring.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 1A:
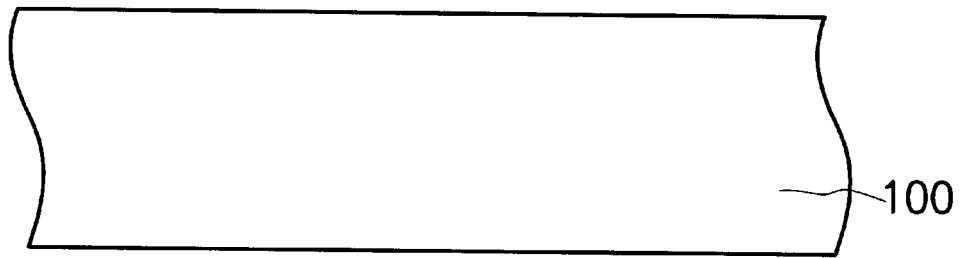
FIGS. 1A–1C are cross-sectional views of a portion of a semiconductor substrate, schematically illustrating a conventional fabrication process for forming a tunneling oxide layer on the semiconductor substrate with a textured surface.
Figure 1B:
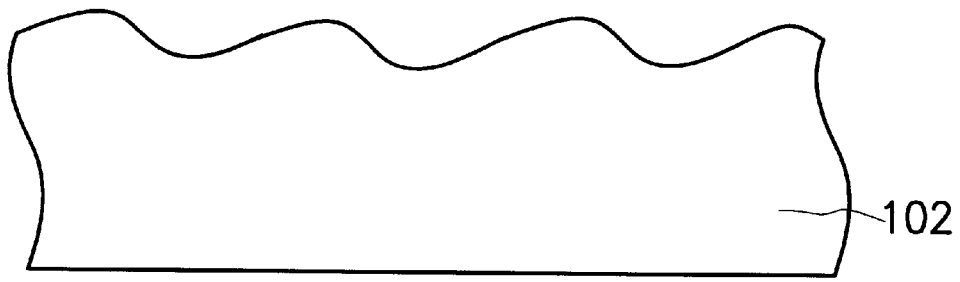
Figure 1C:
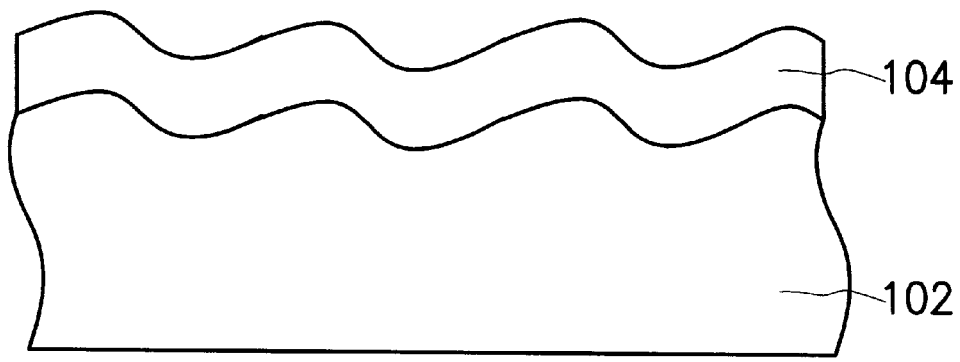
Figure 2A:
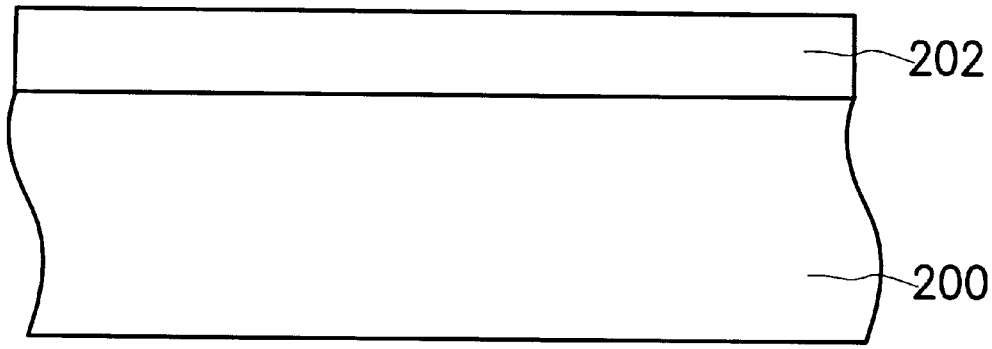
FIG. 2A and FIG. 2B are cross-sectional views of a portion of a semiconductor substrate, sematically illustrating an another conventional fabrication process for forming a tunneling oxide layer on the semiconductor substrate with a textured surface.
Figure 2B:
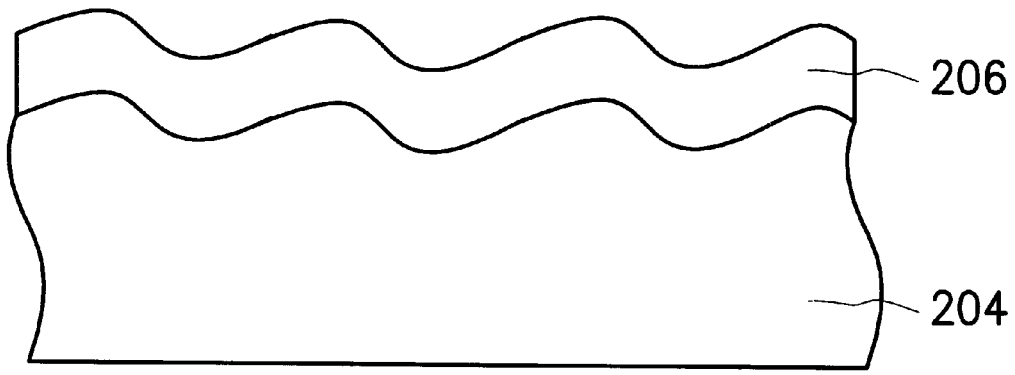
Figure 3A:
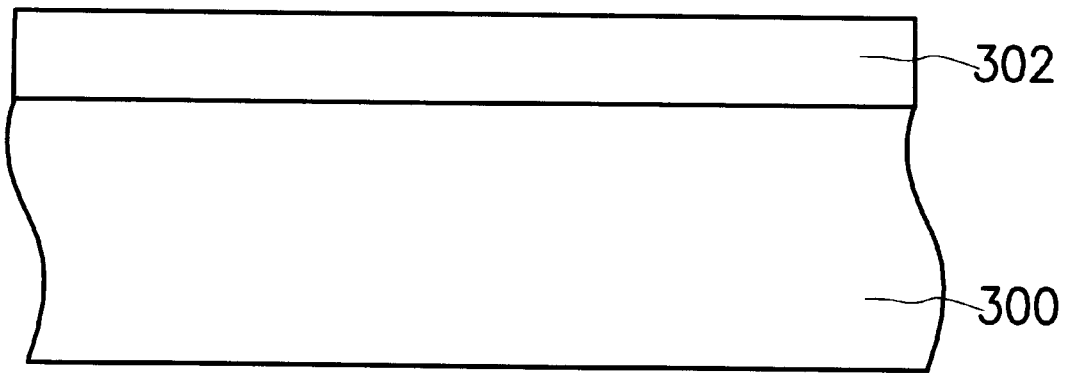
FIGS. 3A–3D are cross-sectional views of a portion of a semiconductor substrate, schematically illustrating a fabrication process for forming a tunneling oxide layer on the semiconductor substrate with a textured surface, according to a preferred embodiment of the invention.

FIGS. 3A–3D are cross-sectional views of a portion of a semiconductor substrate, schematically illustrating a fabrication process for forming a tunneling oxide layer on the semiconductor substrate with a textured surface, according to a preferred embodiment of the invention. In FIG. 3A, a polysilicon layer 302 is formed on a semiconductor substrate 300, such as a silicon substrate. The polysilicon layer 302 has a thickness of about 10 nm and is formed by, for example, low pressure chemical vapor deposition (LPCVD) at a temperature of about 590° C.

Figure 3B:
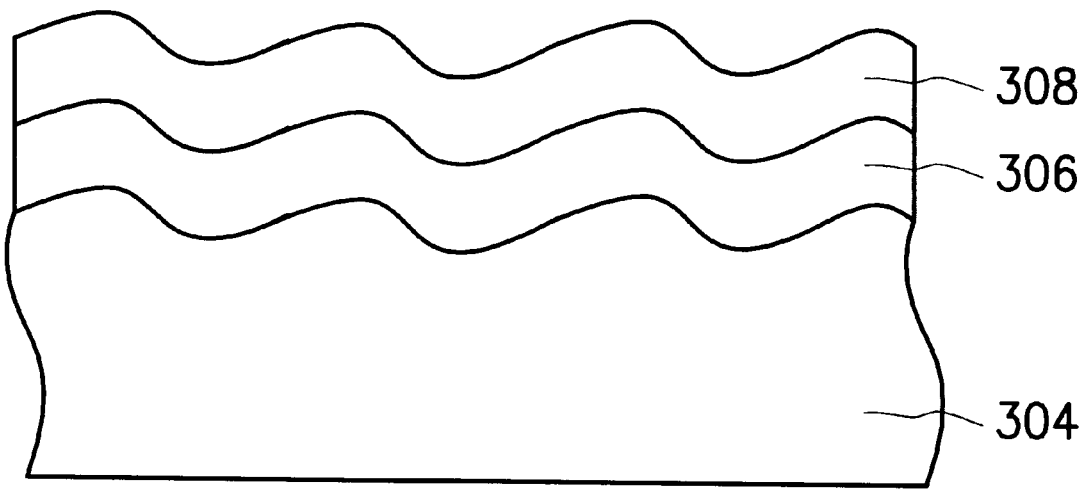

In FIG. 3A and FIG. 3B, an over oxidation process, such as a thermal oxidation process, is performed to over-oxidize the polysilicon layer 302 so that a top portion of the substrate 300 is also oxidized. Since the oxidation rates of the polycrystals and their grain boundaries are different, in which the oxidation rate at the grain boundaries is faster, after the thermal oxidation process the polysilicon layer becomes a textured oxide layer 308, which has a wavy-like structure. Since a top portion of the substrate 300 of FIG. 3A is also oxidized, an interfacial oxide layer 306 is formed between the textured oxide layer 308 and a textured substrate 304, which is a result of the substrate 300 after the thermal oxidation process. The property of the different oxidation rates in the polysilicon layer 302 also causes the interfacial oxide layer 306 and the surface of the textured substrate 304 has a wavy-like structure. The textured substrate 304 is therefore includes a textured surface on top. Since both the textured oxide layer 308 and the interfacial oxide layer 306 are sacrificial, it is not necessary to precisely control the over oxidation process of the invention to just oxidize the polysilicon layer 302 of FIG. 3A. This can simplify the fabrication process with loose fabrication conditions. The total thickness of the interfacial oxide layer 306 and the textured oxide layer 308 is about 30 nm.

Figure 3C:
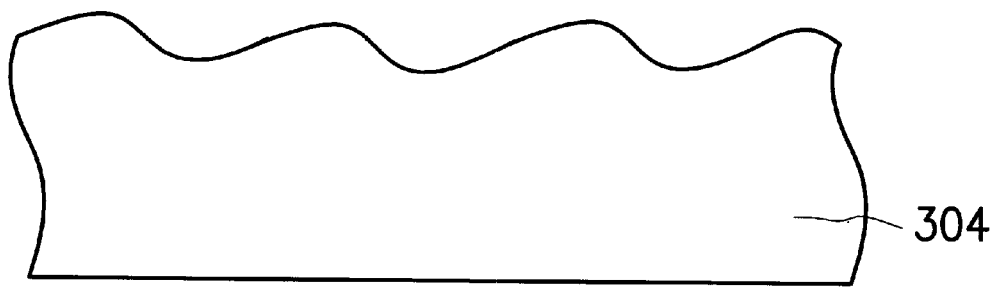

In FIG. 3C, the interfacial oxide layer 306 and the textured oxide layer 308 are removed by, for example, wet etching or dry etching to leave the textured substrate 304 with the textured surface.

Figure 3D:
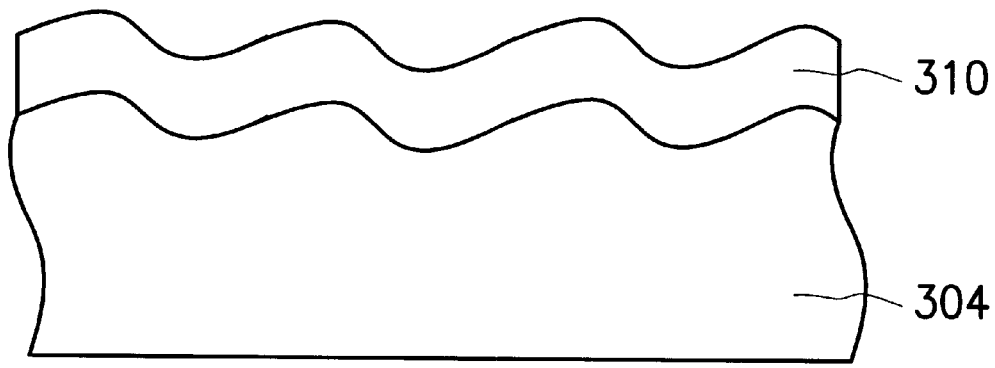

In FIG. 3D, an oxide layer 310 is formed over the substrate 304. The oxide layer 310 serving a gate oxide layer is conformal to the textured surface and is also called as a tunneling oxide layer in a EEPROM device, which uses Fowler-Nordheim tunneling effect to perform reading/writing mechanism. The oxide layer 310 is formed by, for example, thermal oxidation.

The rest fabrication processes to accomplish a EEPROM are well known by the one skilled in the art and are not further described here.

In the invention, the oxide layer 310, that is, the tunneling oxide layer 310 is formed on the textured substrate 304, which is formed by the over oxidation process. The tunneling oxide layer 310, with a comparison with a normal tunneling oxide layer formed on a substrate without textured surface, has several properties to be described in the following.

Figure 4:
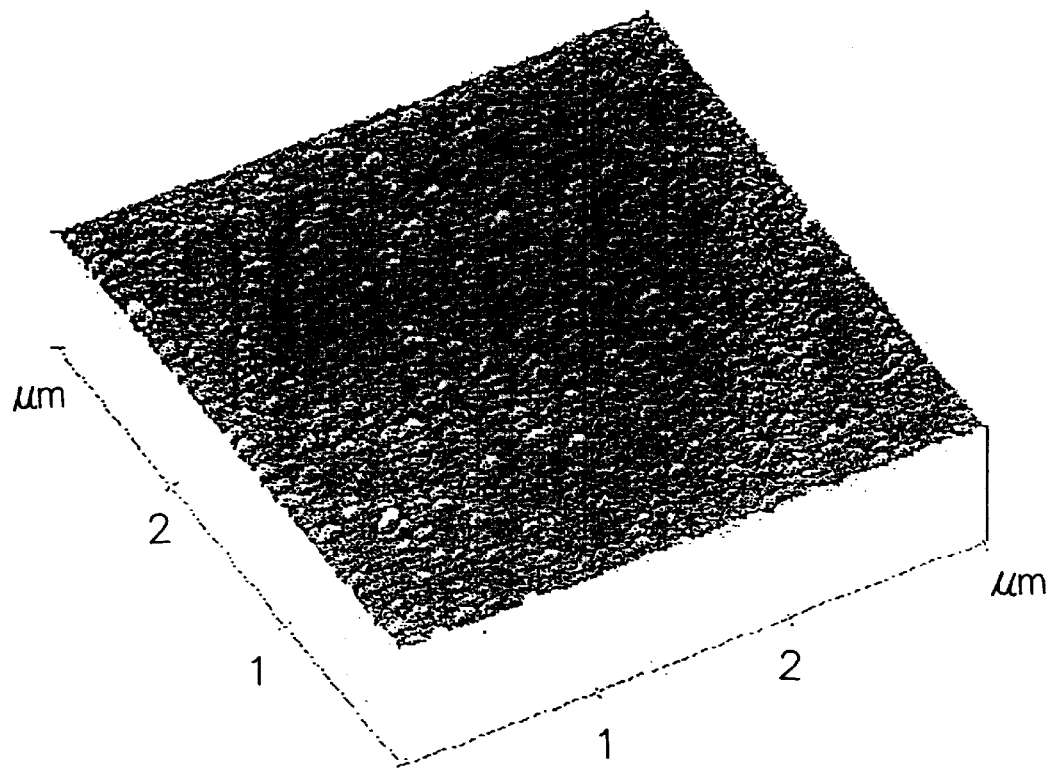
FIG. 4 is a surface contour of the substrate with the textured surface, according to the preferred embodiment of the invention, in which the surface contour is taken by an atomic force microscope.

1. After removing the interfacial oxide layer 306 and the textured layer 308, the textured surface formed by the invention has a sufficient textured contour as shown in FIG. 4. FIG. 4 is a textured surface contour of the substrate with the textured surface, according to the preferred embodiment of the invention, in which the textured surface contour is taken by an atomic force microscope.

Figure 5:
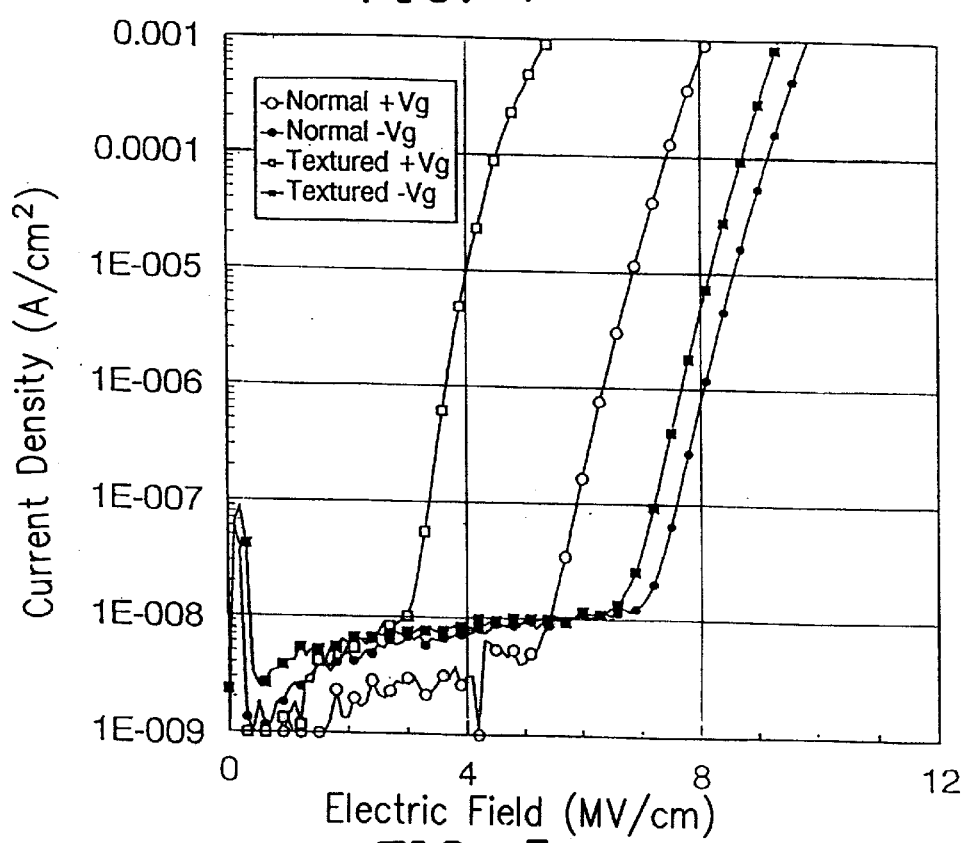
FIG. 5 shows curves of current density versus electric field intensity applied on the tunneling oxide layer, according to the preferred embodiment of the invention.

2. The tunneling oxide layer 310, formed on the textured substrate 304, has a better performance. FIG. 5 shows curves of current density versus electric field intensity applied on the tunneling oxide layer, according to the preferred embodiment of the invention. The vertical axis is current density, having a unit of A/cm$^2$, and the horizontal axis is quantity of electric field with a unit of mega-volt (MV)/cm. The lines with line circle points or filled circle points are the measured data on the normal tunneling oxide layer formed on a substrate without textured surface. The lines with line square points or filled square point are the measured data on the tunneling layer 310 of the preferred embodiment. The line points and filled points respectively are taken with a positive voltage and a negative voltage applied on both the tunneling oxide layer 310 and the normal tunneling oxide layer. The textured surface allows the tunneling effect to occur at a much lower electric field applied on the tunneling oxide layer. A lower electric field on the tunneling oxide layer 310 characterizes a lower operation voltage.

Figure 6:
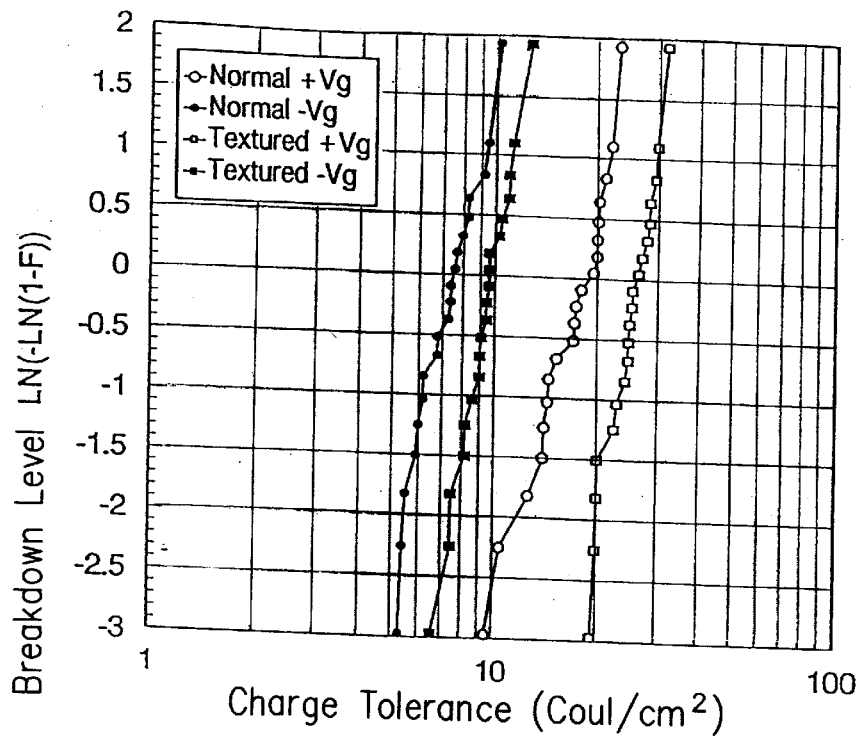
FIG. 6 shows curves of relative breakdown level versus charge tolerance in the tunneling oxide layer, according to the preferred embodiment of the invention.

3. The tunneling oxide layer 310 has a better reliability. FIG. 6 shows curves of relative breakdown level versus charge tolerance in the tunneling oxide layer, according to the preferred embodiment of the invention. The vertical axis is a breakdown level of tunneling oxide layer, and the horizontal axis is charge tolerance of tunneling oxide layer in a unit of Coul/cm$^2$. The breakdown level is represented by a formula of $\ln(-\ln(1-F))$, where the F is a failure probability. A fixed current source with a current density of 100 mA/cm$^2$ is impulse on both conventional tunneling oxide layer and the tunneling oxide layer 310 of the invention. With the same meaning of the marked points of the measured data in FIG. 5, the tunneling oxide layer 310 of the invention has a greater charge tolerance so that the tunneling oxide layer 310 has greater reliability than that of the conventional tunneling oxide layer without textured surface.

Figure 7A:
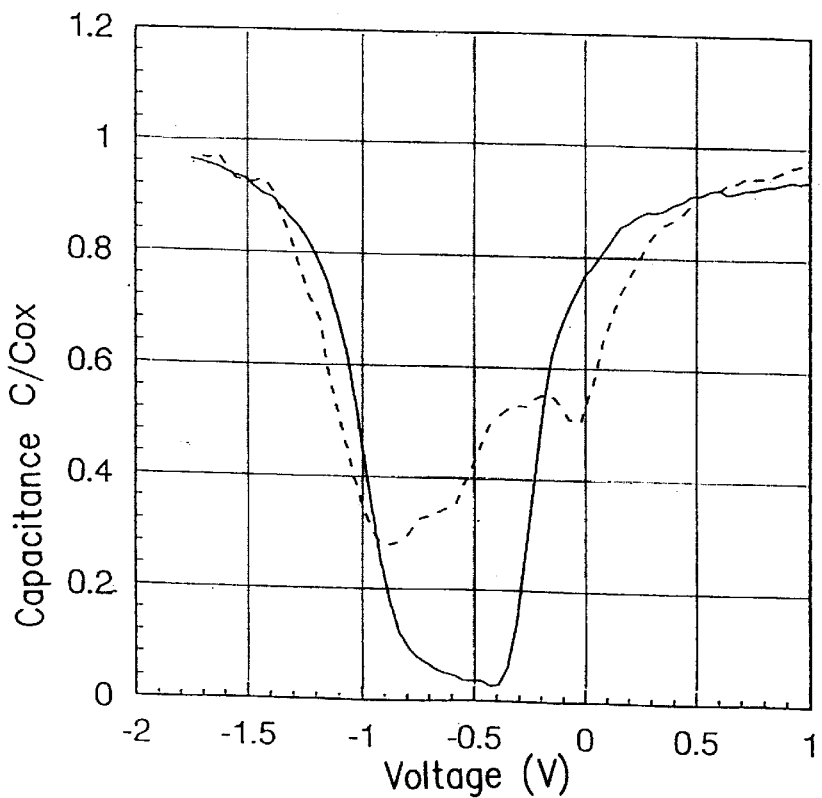
FIG. 7A shows curves of capacitance distribution varying with voltage applied on normal tunneling oxide layer formed on a conventional substrate without textured surface.
Figure 7B:
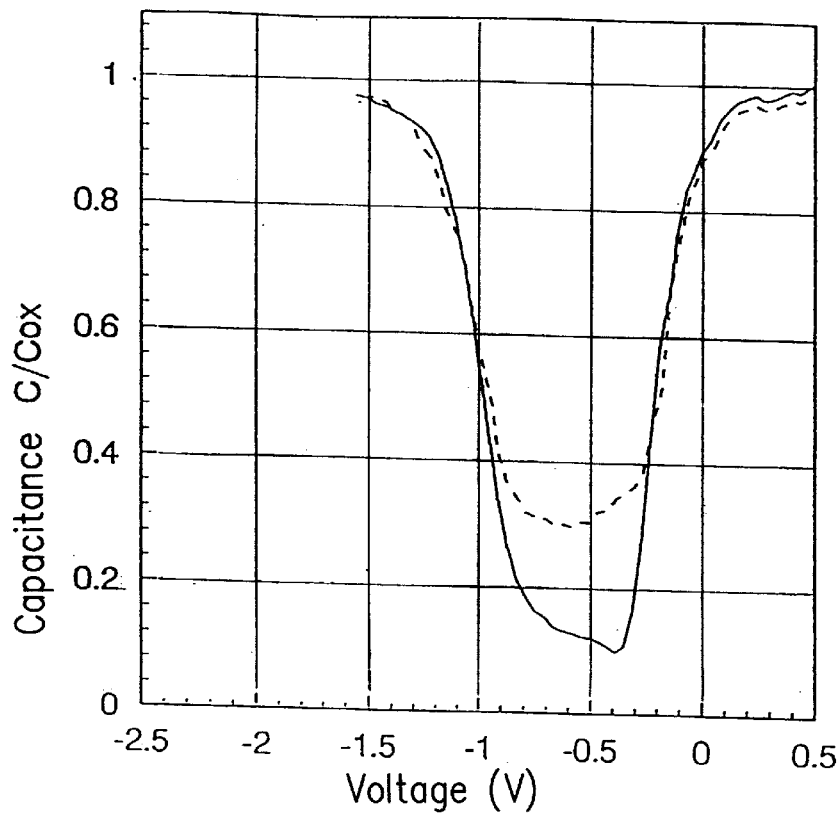
FIG. 7B shows curves of capacitance distribution varying with voltage applied on the tunneling oxide layer according to the preferred embodiment of the invention.

4. The tunneling oxide layer 310 has a better capacitance performance. FIG. 7A shows curves of capacitance distribution varying with voltage applied on the normal tunneling oxide layer. FIG. 7B shows curves of capacitance distribution varying with voltage applied on the tunneling oxide layer according to the preferred embodiment of the invention. In FIG. 7A and FIG. 7B, the vertical axes are effective capacitance of the tunneling oxide layer 310 and the normal tunneling oxide layer, and the horizontal axes are applied voltage on both the tunneling oxide layers. A current source of 0.1 A/cm$^2$, producing a charge density of 0.2 Coul./cm$^2$ is impulse on both the tunneling oxide layers. In FIG. 7A, the solid line is a curve of an effect capacitance of the normal tunneling oxide layer at low frequency before the electron impulse, and the dashed line is a curve an effect capacitance of the normal tunneling oxide layer at low frequency after the electron impulse. The dashed line has a severe discrepancy to the solid line. In FIG. 7B, the sold line is a curve of an effect capacitance of the tunneling oxide layer 310 at low frequency before the electron impulse, and the dashed line is a curve an effect capacitance of the tunneling oxide layer 310 at low frequency after the electron impulse. Due to the textured surface, the dashed line has similar property to the property of he solid line. The capacitance is not severely distorted.

Figure 8:
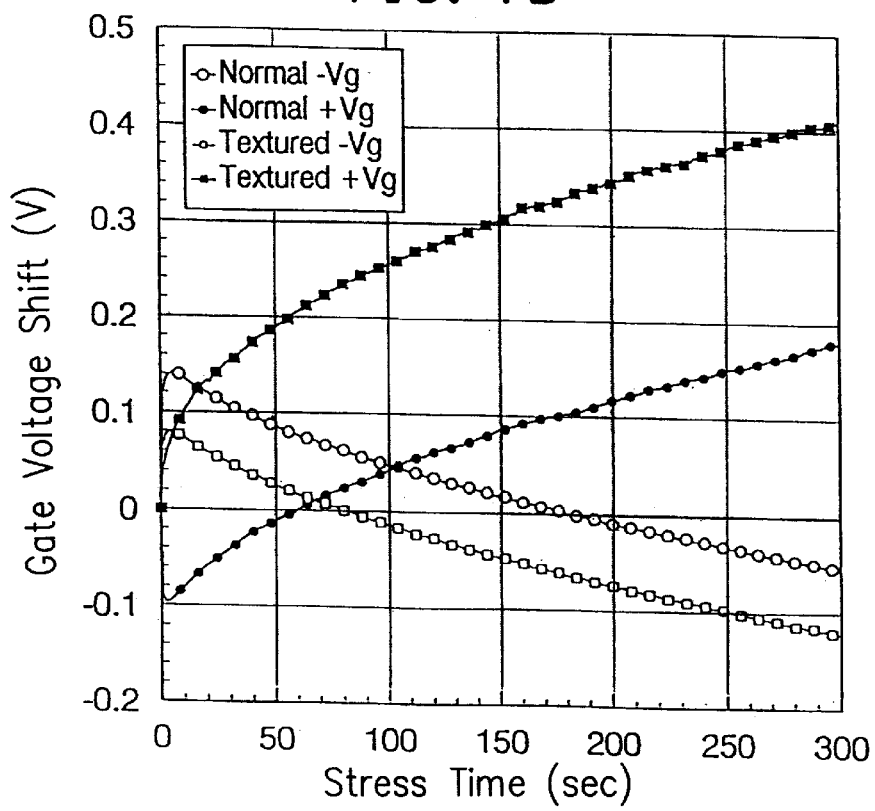
FIG 8 shows curves of gate voltage shift versus electron stress time on the tunneling oxide layer according to the preferred embodiment of the invention.

5. The tunneling oxide layer 310 produces much less electron-hole traps. FIG. 8 shows curves of gate voltage shift versus electron stress time on the tunneling oxide layer according to the preferred embodiment of the invention. In FIG. 8, the marked points of the measured data is the same as in FIG. 5. The vertical axis is a quantity of gate voltage shift, and the horizontal axis is stress time of the electron impulse. A current source of 100 mA/cm$^2$ is impulse on the tunneling oxide layer 310 and the normal tunneling oxide layer. The tunneling oxide layer 310 of the invention has much less electron-hole traps so that the gate voltage shift goes higher as the stress time gets longer.

According to above description, the tunneling oxide layer 310 of the invention has sufficient properties to be applied in a memory device, such as the EEPROM. The properties of the tunneling oxide layer 310 are also better a conventional tunneling oxide layer formed on a substrate with a conventional texture surface as shown in FIGS. 1A–1C and FIGS. 2A and 2B.

In conclusion, the method for fabricating the oxide layer 310 in the invention includes several characteristics as follows:

1. The formation of the oxide layer 310 has lower fabrication complexity and higher reliability since the polysilicon layer 302 without too thick can be easily formed on the substrate 300. The over oxidation process is performed to over-oxidize the polysilicon layer 302 so as to allow the top portion of the substrate 300 to be also oxidized. The interfacial oxide layer is naturally formed to obtain a textured surface on top of the substrate. The over oxidation process has loose fabrication conditions so that the textured surface on the substrate can be more easily formed with a higher reliability.

2. The texture surface formed on the textured substrate 304 allows the oxide layer 310 to be formed with a much better performance than that of a substrate without textured surface.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating a textured surface on a semiconductor substrate, the method comprising:

forming a polysilicon layer on the semiconductor substrate;

performing an over oxidation process to oxidize the polysilicon layer and a top portion of the semiconductor substrate so as to form an oxide layer; and removing the oxide layer formed by over oxidation process, wherein the semiconductor substrate comprises a textured surface on top.

2. The method of claim 1, wherein the semiconductor substrate comprises a silicon substrate.

3. The method of claim 1, wherein the polysilicon layer comprises a thickness of about 10 nm.

4. The method of claim 1, wherein the step of forming the polysilicon layer comprises low pressure chemical vapor deposition (LPCVD).

5. The method of claim 1, wherein the oxidation process comprises a thermal oxidation process.

6. The method of claim 1, wherein the oxide layer comprises a thickness of about 30 nm.

7. The method of claim 1, wherein the step of removing the oxide layer comprising wet etching.

8. The method of claim 1, wherein the step of removing the oxide layer comprising dry etching.

9. The method of claim 1, wherein the oxide layer further comprises a textured oxide layer originating from the polysilicon layer being oxidized, and an interfacial oxide layer between the textured oxide layer and the semiconductor substrate, which is also partially oxidized on top.

10. A method for fabricating a tunneling oxide layer a semiconductor substrate with a textured surface on top, the method comprising:

providing a native semiconductor substrate;

forming a polysilicon layer on the native semiconductor substrate;

performing an over oxidation process to oxidize the polysilicon layer and a top portion of the native semiconductor substrate so as to form an oxide layer;

removing the oxide layer formed by over oxidation process, wherein the native semiconductor substrate becomes a textured semiconductor substrate with the textured surface on top; and forming a tunneling oxide layer on the textured semiconductor substrate.

11. The method of claim 10, wherein the native semiconductor substrate comprises silicon.

12. The method of claim 10, wherein the polysilicon layer comprises a thickness of about 10 nm.

13. The method of claim 10, wherein the step of forming the polysilicon layer comprises low pressure chemical vapor deposition (LPCVD).

14. The method of claim 10, wherein the oxidation process comprises a thermal oxidation process.

15. The method of claim 10, wherein the oxide layer comprises a thickness of about 30 nm.

16. The method of claim 10, wherein the step of removing the oxide layer comprising wet etching.

17. The method of claim 10, wherein the step of removing the oxide layer comprising dry etching.

18. The method of claim 10, wherein the oxide layer further comprises a textured oxide layer originating from the polysilicon layer being oxidized, and an interfacial oxide layer between the textured oxide layer and the textured semiconductor substrate.

19. The method of claim 10, wherein the step of forming the tunneling oxide layer comprises a thermal oxidation process.

20. The method of claim 10, wherein the tunneling oxide layer is conformal to the textured surface on the textured semiconductor substrate.

* * * * *